United States Patent
Okajima

(10) Patent No.: US 7,053,634 B2
(45) Date of Patent: May 30, 2006

(54) TEST PATTERN FOR TESTING CONTACT RESISTANCE OF A SUBJECT VIA HOLE

(75) Inventor: Takehiko Okajima, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 11 days.

(21) Appl. No.: 10/444,129

(22) Filed: May 23, 2003

(65) Prior Publication Data
US 2003/0218168 A1    Nov. 27, 2003

(30) Foreign Application Priority Data
May 24, 2002    (JP)    ............................. 2002-150534

(51) Int. Cl.
*G01R 31/26*    (2006.01)
(52) U.S. Cl. .................. 324/719; 324/713; 324/763; 324/765; 257/48
(58) Field of Classification Search ........ 324/754–765, 324/713, 715, 719, 158.1, 73.1; 257/48
See application file for complete search history.

(56) References Cited

U.S. PATENT DOCUMENTS

| | | | | |
|---|---|---|---|---|
| 5,640,097 A | * | 6/1997 | Hada ........................... | 324/713 |
| 5,663,651 A | * | 9/1997 | Hada ........................... | 324/713 |
| 6,054,720 A | * | 4/2000 | Fieselman et al. ............ | 257/48 |
| 6,362,638 B1 | * | 3/2002 | Ashton et al. .............. | 324/755 |

FOREIGN PATENT DOCUMENTS

| | | |
|---|---|---|
| JP | 04-0077851 | 1/1992 |
| JP | 06-123759 | 5/1994 |

\* cited by examiner

*Primary Examiner*—Paresh Patel
(74) *Attorney, Agent, or Firm*—Rabin & Berdo, P.C.

(57) ABSTRACT

A test pattern for testing contact resistance of a subject via hole. The test pattern includes first and second conductive patterns respectively formed on lower and upper substrate surfaces and connected to the subject via hole. First and second electrodes are formed on the second conductive pattern. Third and fourth electrodes are formed on the substrate upper surface. First and second test via-holes are formed through the substrate to connect the first conductive pattern to the third electrode and the first conductive pattern to the fourth electrode, respectively. The first and third electrodes are connected to a current test probe so that a test current flows through the first electrode, the subject via hole, the test via-hole and then the third electrode. The second and fourth electrodes are connected to a voltage test probe so as that a test voltage is applied through the second electrode, the subject via hole, the second test via-hole and then the fourth electrode.

4 Claims, 7 Drawing Sheets

F I G. 3A
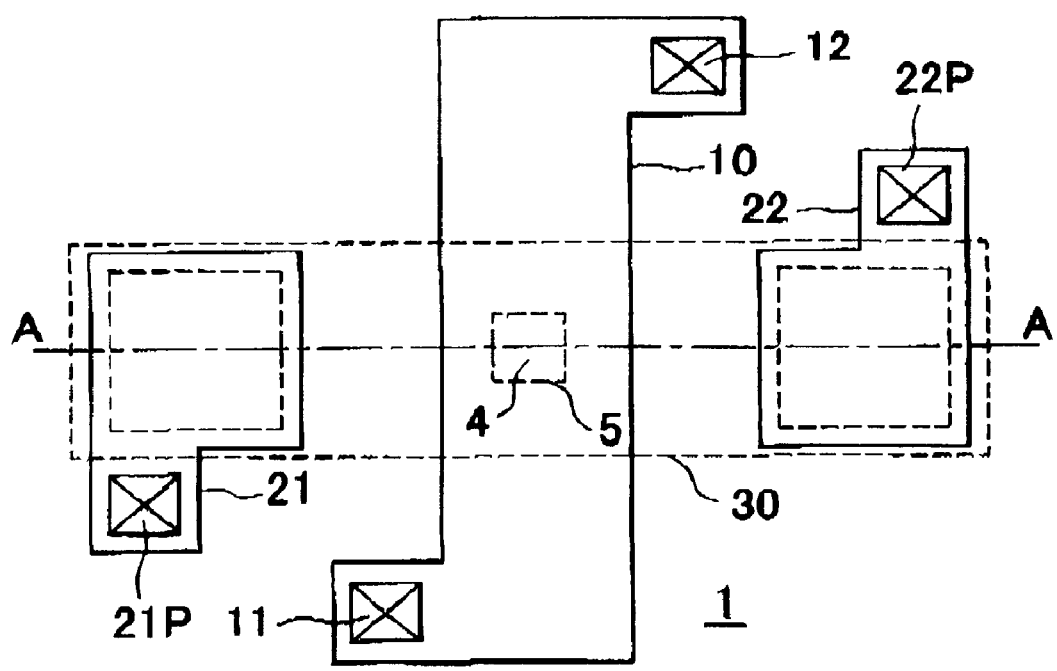
F I G. 3B
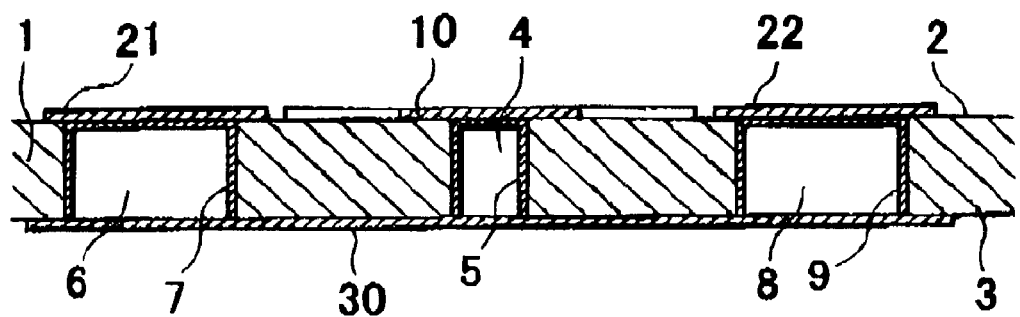

TEST PATTERN FOR TESTING CONTACT RESISTANCE OF A SUBJECT VIA HOLE

CROSS REFERENCE TO RELATED APPLICATION

This application claims the priority of Application No. 2002-150534, filed May 24, 2002 in Japan, the subject matter of which is incorporated herein by reference.

TECHNICAL FIELD OF THE INVENTION

This invention relates to a test pattern formed on a semiconductor substrate.

BACKGROUND OF THE INVENTION

FIG. 1A is a plane plan view showing a conventional test pattern used for measuring a contact resistance of a via-hole formed in a semiconductor substrate. FIG. 1B is a cross-sectional view taken on line X—X in FIG. 1A.

The conventional test pattern (conductive pattern or wiring pattern) is used for measuring a contact resistance of a conductive material 5 formed inside a via hole 4, formed in a semiconductor substrate 1. The semiconductor substrate 1 includes an upper surface 2 and a lower (or bottom) surface 3. The via hole 4 is formed to pass through the semiconductor substrate 1.

The test pattern includes an upper wiring pattern 40 formed on the upper surface 2 of the semiconductor substrate 1 and a lower (or bottom) wiring pattern 50 formed on the lower surface 3 of the semiconductor substrate 1.

The upper wiring pattern 40 includes a pad (electrode) 41 to be in contact with a current supply probe, a pad 42 to be in contact with a voltage supply probe, and a contact pattern 43 to electrically connect the pads 41 and 42 to the conductive material 5. The pads 41 and 42 and contact pattern 43 is formed in united body on the upper surface 2 of the semiconductor substrate 1.

The lower wiring pattern 50 includes a pad (electrode) 51 to be in contact with a current supply probe, a pad 52 to be in contact with a voltage supply probe, and a contact pattern 53 to electrically connect the pads 51 and 52 to the conductive material 5. The pads 51 and 52 and contact pattern 53 is formed in united body on the lower surface 3 of the semiconductor substrate 1.

FIG. 2 is circuit diagram of the conventional test pattern, shown in FIGS. 1A and 1B.

As shown in FIG. 2, the pads 41 and 51 are in contact with probes P1 and P2, respectively, so that a predetermined amount of electric current I is supplied from a direct power supply (DC) to the pads, 41 and 51. The current I flows along a path formed by the probe P1, the pad 41, the conductive pattern 43, the conductive material 5, the conductive pattern, the pad 51 and the P2 in this order. As a result, a voltage, calculated by multiplying the current I and the contact resistance of the conductive material 5, is applied between the ends of the conductive material 5.

On the other hand, the pads 42 and 52 are in contact with probes P3 and P4, respectively. The voltage (potential) V applied between the pads 42 and 45 is measured by a voltage meter VM.

The voltage meter VM should have a high sensitivity so that the voltage V can be assumed to be the same as a voltage applied over the ends of the conductive material 5. Therefore, the contact resistance R of the conductive material 5 is calculated by the following equation: $R = V/I$ However, according to the above-described conventional test pattern, the pads 41 and 42 are arranged on the upper surface 2 of the semiconductor substrate 1 while the pads 51 and 52 are arranged on the lower surface 3 of the semiconductor substrate 1; and therefore, the probes P1 to P4 are required to be arranged in contact with the pads 41, 42, 51 and 52 from the both sides of the semiconductor substrate 1. As a result, it is required to use a specially-designed device for measuring or testing electrical characteristics of the semiconductor substrate 1.

OBJECTS OF THE INVENTION

Accordingly, an object of the present invention is to provide a test pattern with which electrical characteristics of a semiconductor substrate may be easily measured or tested.

Additional objects, advantages and novel features of the present invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

According to an aspect of the present invention, a test pattern used for testing an electrical characteristic of a semiconductor substrate, includes: a first conductive pattern formed on a lower surface of the semiconductor substrate; a second conductive pattern formed on an upper surface of the semiconductor substrate; first and second electrodes formed on the second conductive pattern, the electrodes being connected to test probes; and a first test via-hole formed through the semiconductor substrate to connect the first and second conductive pattern electrically to each other.

BRIEF DESCRIPTION OF THE DRAWINGS

FIG. 3A is a plan view showing a test pattern, according to a first preferred embodiment of the present invention, used for measuring a contact resistance of a via-hole formed in a semiconductor substrate.

FIG. 3B is a cross-sectional view taken on line A—A in FIG. 3A.

DETAILED DISCLOSURE OF THE INVENTION

Figure 1A:
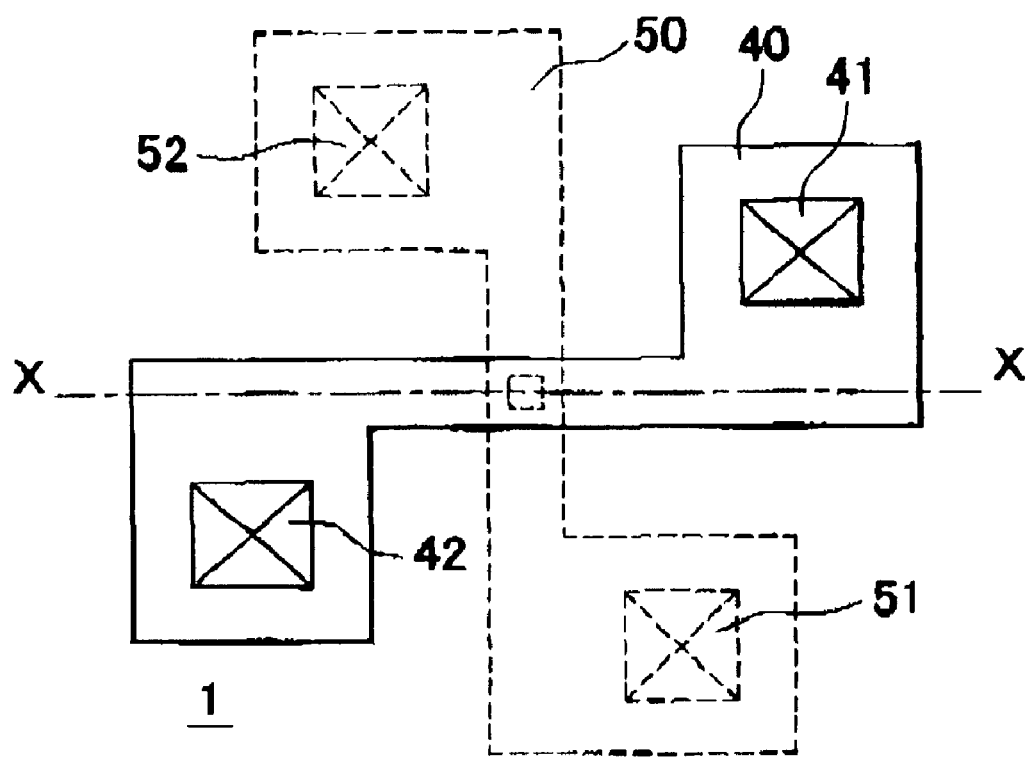
FIG. 1 A is a plan view showing a conventional test pattern used for measuring a contact resistance of a via-hole formed in a semiconductor substrate.
FIG. 1B is a cross-sectional view taken on line X—X in FIG. 1A.
Figure 1B:
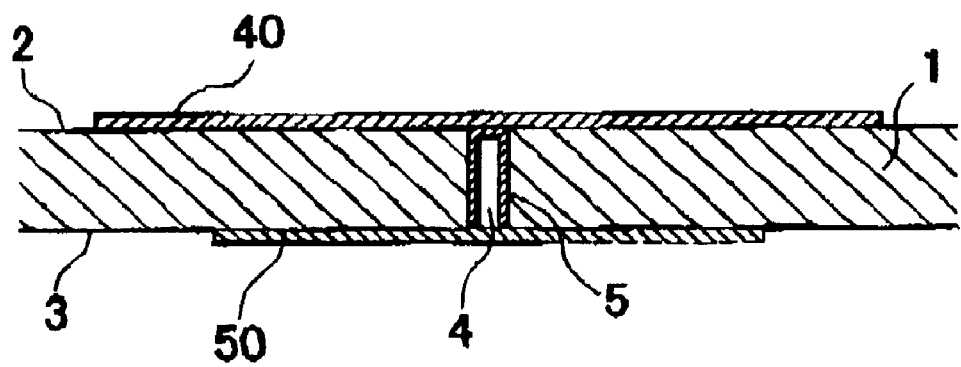
Figure 2:
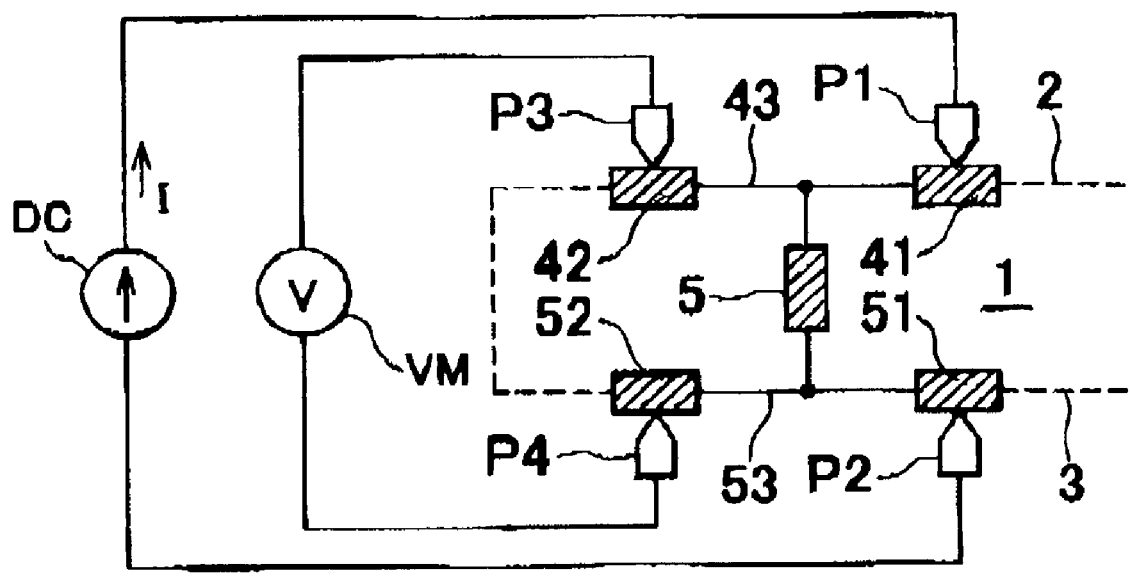
FIG. 2 is circuit diagram of the conventional test pattern, shown in FIGS. 1A and 1B.

In the following detailed description of the preferred embodiments, reference is made to the accompanying drawings which form a part hereof, and in which is shown by way of illustration specific preferred embodiments in which the inventions may be practiced. These preferred embodiments are described in sufficient detail to enable those skilled in the art to practice the invention, and it is to be understood that other preferred embodiments may be utilized and that logical, mechanical and electrical changes may be made without departing from the spirit and scope of the present inventions. The following detailed description is, therefore, not to be taken in a limiting sense, and scope of the present inventions is defined only by the appended claims.

FIG. 3A is a plan view showing a test pattern, according to a first preferred embodiment of the present invention, used for measuring a contact resistance of a via-hole formed in a semiconductor substrate. FIG. 3B is a cross-sectional view taken on line A—A in FIG. 3A.

The test pattern (conductive pattern or wiring pattern) is used for measuring a contact resistance of a conductive material 5 formed inside a via hole 4, formed in a semiconductor substrate 1. The semiconductor substrate 1 includes an upper surface 2 and a lower (or bottom) surface 3. The via hole 4 is formed to pass through the semiconductor substrate 1.

The test pattern includes an upper wiring pattern 10 formed on the upper surface 2 of the semiconductor substrate 1 and a lower (or bottom) wiring pattern 30 formed on the lower surface 3 of the semiconductor substrate 1.

The upper wiring pattern 10 includes a pad (electrode) 11 to be in contact with a current supply probe, a pad 12 to be in contact with a voltage supply probe and a contact pattern 13 to electrically connect the pads 11 and 12 to the conductive material 5. The pads 11 and 12 and contact pattern 13 is are formed in a united body on the upper surface 2 of the semiconductor substrate 1.

The test pattern further includes other upper pattern 21 and 22, which are not overlapped with the wiring pattern 10 on the upper surface 2 of the semiconductor substrate 1. The upper patterns 21 and 22 are electrically connected to the lower wiring pattern 30 through via holes 6 and 8, respectively. The upper patterns 21 and 22 are provided thereon with pads 21P and 22P, which are to be in contact with a current supply probe and a voltage-measuring probe, respectively.

The lower wiring pattern 30 is shaped to extend and to connect the conductive material 5 to test via-holes 6 and 8. The test via-holes 6 and 8 are provided with conductive inner layers 7 and 9, which are electrically connected to the patterns 21 and 22 on the upper surface 2, respectively.

Figure 4:
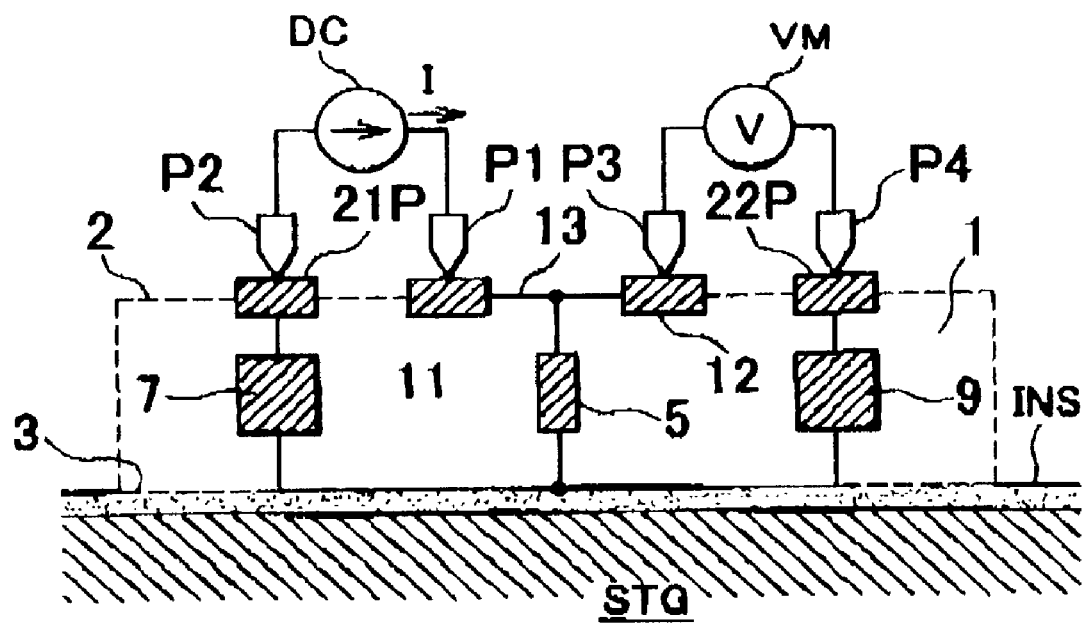
FIG. 4 is circuit diagram of the test pattern according to the first preferred embodiment, shown in FIGS. 3A and 3B.

FIG. 4 is circuit diagram of the test pattern according to the first preferred embodiment, shown in FIGS. 3A and 3B. Now a method for measuring a contact resistance of the conductive material 5 is described in connection with FIG. 4.

First, an insulating material INS, for example, paper or quartz is arranged on a test stage STG. Next, the semiconductor substrate 1 is placed on the insulation material INS so that the upper surface 2 faces up.

Subsequently, current supply probes P1 and P2 are contacted to the pad 11 on the upper wiring pattern (upper circuit pattern) 10 and the pad 21P on the upper test pattern 21, respectively. A direct current supply DC supplies a constant current I to the probes P1 and P2. On the other hand, voltage measuring probes P3 and P4 are contacted to the pads 12 and 22P, respectively, so that a voltage is measured by a voltage meter VM.

When the constant current I is supplied to the probe P1, the current flows along the path formed by the pad 11, the connection pattern 13, the conductive material (inside wall) 5, the lower wiring pattern 30, the conductive material (inside wall) 7, the pad 21P and the probe P2, in this order. As a result, a voltage, calculated by multiplying the current I and the contact resistance of the conductive material 5, is applied between the ends of the conductive material 5.

On the other hand, the pad P3 is applied with a voltage at an upper side of the conductive material 5 through the connection pattern 13 and the pad 12. The probe P4 is applied with a voltage at a lower side of the conductive material 5 through the lower wiring pattern 30, the conductive material 9 and the pad 22P. The voltage (potential) V applied between the pads 12 and 22 is measured by the voltage meter VM.

The voltage meter VM should have a high sensitivity so that the voltage V can be assumed to be the same as a voltage applied over the ends of the conductive material 5. Therefore, the contact resistance R of the conductive material 5 is calculated by the following equation: $R=V/I$ As described above, according to the first preferred embodiment, all the pads 11, 12, 21P and 22P used for testing are formed on the upper surface 2 of the semiconductor substrate 1. Therefore, measurement plan electrical characteristic of the semiconductor substrate 1 can be performed easily.

Figure 5A:
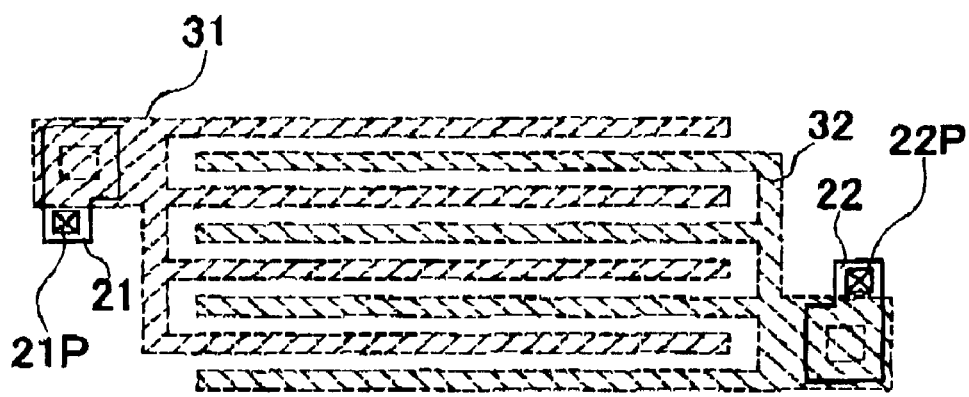
FIG. 5A is a plan view showing a test pattern, according to a second preferred embodiment of the present invention, used for measuring an insulation resistance of a semiconductor substrate.
Figure 5B:
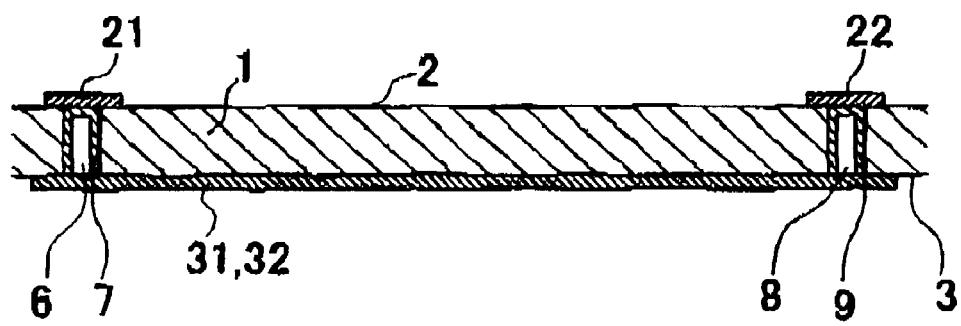
FIG. 5B is a cross-sectional view of FIG. 5A.

FIG. 5A is a plan view showing a test pattern, according to a second preferred embodiment of the present invention, used for measuring an insulation resistance of a semiconductor substrate. FIG. 5B is a cross-sectional view of FIG. 5A.

The test pattern shown in FIGS. 5A and 5B is used for measuring an insulation resistance of the semiconductor substrate. The pattern includes upper patterns 21 and 22 and lower wiring patterns 31 and 32. The lower wiring patterns 31 and 32 are shaped to be comb-branched patterns, which are arranged to be opposed and nested or interlocked but not to be in contact to each other.

The semiconductor substrate 1 includes a couple of via holes 6 and 8, which are provided with conductive inner materials 7 and 9. The lower wiring pattern 31 is electrically connected to the upper pattern 21 through the conductive material 7 in the via hole 6. A pad 21P is formed on the upper pattern 21 so that a test probe is in contact therewith.

The lower wiring pattern 32 is electrically connected to the upper pattern 22 through the conductive material 9 in the via hole 8. A pad 22P is formed on the upper pattern 22 so that a test probe is in contact therewith.

In a measurement process, first, an insulating material, for example, paper or quartz is arranged on a test stage. Next, the semiconductor substrate 1 is placed on the insulation material so that the upper surface 2 faces up. Subsequently, the probes are contacted with the pads 21P and 22P and a resistance between those pads is measured.

As described above, according to the second preferred embodiment, both the pads 21P and 22P used for testing are formed on the upper surface 2 of the semiconductor substrate 1. As a result, the upper surface 2, on which a micro-designed circuit is formed, is not in contact with a test stage; and therefore, measurement of an electrical characteristic of the semiconductor substrate 1 can be performed easily. Further, the upper surface 2 of the semiconductor substrate 1 is prevented from being damaged and having particles thereon.

Figure 6:
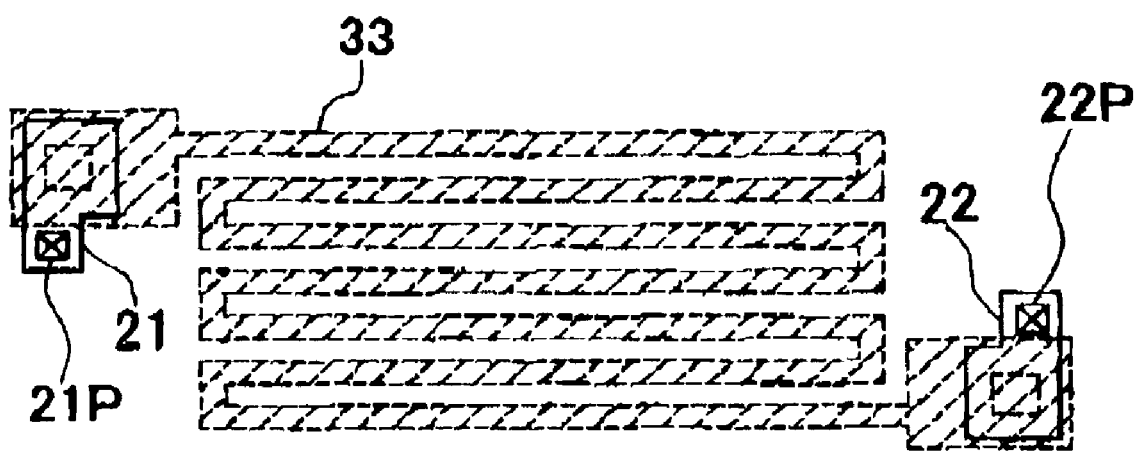
FIG. 6 is a plan view showing a test pattern, according to a third preferred embodiment of the present invention, used for measuring a wiring resistance of a semiconductor substrate.

FIG. 6 is a plan view showing a test pattern, according to a third preferred embodiment of the present invention, used for measuring a wiring resistance of a semiconductor substrate.

The test pattern shown in FIG. 6 is used for measuring a wiring resistance of the semiconductor substrate. The pattern includes upper patterns 21 and 22 and a lower wiring pattern 33. The lower wiring pattern 33 is wound or shaped in a zigzag path.

The semiconductor substrate 1 includes a couple of via holes, which are provided with conductive inner materials, in the same manner as the above described second preferred embodiment. One end of the wiring pattern 33 is electrically connected to the upper pattern 21 through the via hole. A pad 21P is formed on the upper pattern 21 so that a test probe is in contact therewith.

The other end of the wiring pattern 33 is electrically connected to the upper pattern 22 through the via hole. A pad 22P is formed on the upper pattern 22 so that a test probe is in contact therewith.

In a measurement process, first, an insulating material, for example, paper or quartz is arranged on a test stage. Next, the semiconductor substrate 1 is placed on the insulation material so that the upper surface 2 faces up. Subsequently, the probes are contacted to with the pads 21P and 22P and a resistance between those pads is measured.

As described above, according to the second preferred embodiment, both the pads 21P and 22P used for testing are formed on the upper surface 2 of the semiconductor substrate 1. As a result, the upper surface 2, on which a micro-designed circuit is formed, is not in contact with a test stage; and therefore, measurement of an electrical characteristic of the semiconductor substrate 1 can be performed easily. Further, the upper surface 2 of the semiconductor substrate 1 is prevented from being damaged and having particles thereon.

Figure 7:
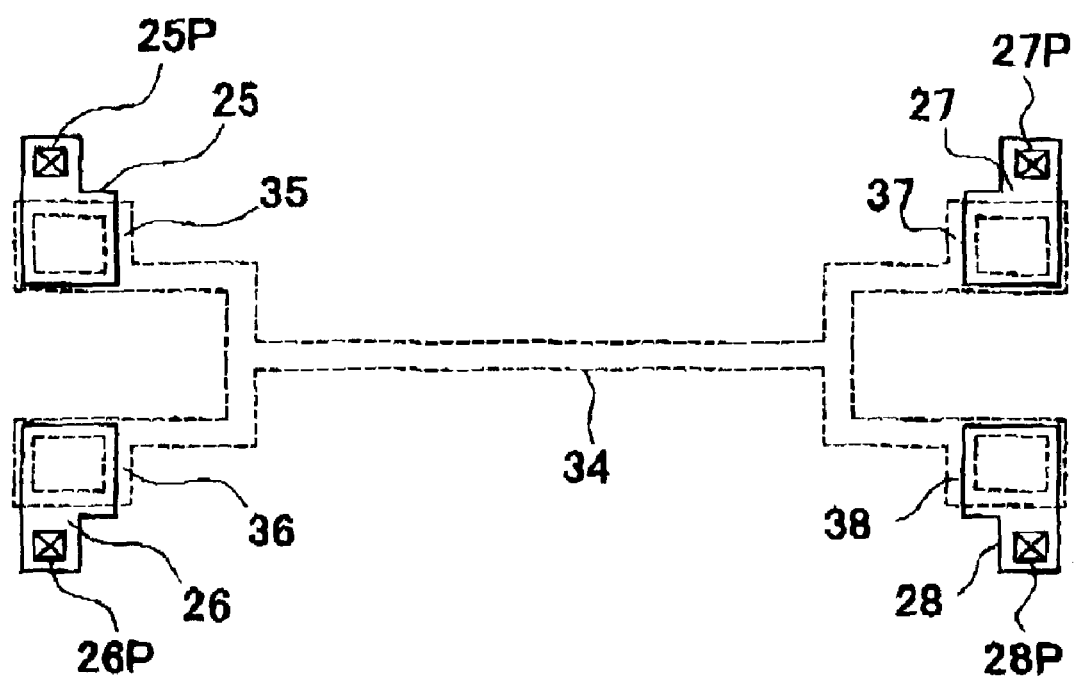
FIG. 7 is a plan view showing a test pattern, according to a fourth preferred embodiment of the present invention, used for measuring a wiring resistance of a semiconductor substrate.

FIG. 7 is a plan view showing a test pattern, according to a fourth preferred embodiment of the present invention, used for measuring a wiring resistance of a semiconductor substrate.

The test pattern shown in FIG. 7 is used for measuring a wiring resistance of the semiconductor substrate. The pattern includes upper patterns 25, 26, 27 and 28 and a lower wiring pattern (34, 35, 36, 37 and 38). The lower wiring pattern 34 is shaped to have a center portion 34 extending straight and terminal portions 35, 36, 37 and 38. The terminal portions 35 and 36 are arranged at one end of the center portion 34, while the terminal portions 37 and 38 are arranged at the other end of the center portion 34. The center portion 34 and the terminal portions 35–38 are formed in one united body.

The semiconductor substrate 1 includes four via holes, which are provided with conductive inner materials, in the same manner as the above described second and third preferred embodiments. The terminal portions 35–38 are electrically connected to the patterns 25–28, respectively, through the via holes. Pads 25P, 26P, 27P and 28P are formed on the upper patterns 25–28, respectively, so that test probes are contacted thereto.

In a measurement process, first, an insulating material, for example, paper or quartz is arranged on a test stage. Next, the semiconductor substrate 1 is placed on the insulation material so that the upper surface 2 faces up. Subsequently, current supply probes are contacted to the pads 25P and 27P, and voltage measuring probes are contacted to the pads 25P and 28P.

Next, a constant current I is supplied between the pads 25P and 27P, and a voltage V applied between the pads 26P and 28P is measured. Therefore, the wiring resistance R is calculated by the following equation: R=V/I As described above, according to the second preferred embodiment, all the pads 25P to 28P used for testing are formed on the upper surface 2 of the semiconductor substrate 1. As a result, the upper surface 2, on which a micro-designed circuit is formed, is not in contact with a test stage; and therefore, measurement of an electrical characteristic of the semiconductor substrate I can be performed easily. Further, the upper surface 2 of the semiconductor substrate 1 is prevented from being damaged and having particles thereon.

Wiring patterns formed on the upper and lower surfaces 2 and 3 of the semiconductor substrate are not limited by the above described embodiments.

The invention may be applied to a measurement of any of electric characteristics, for example, capacitance and inductance, in addition to insulation resistance and wiring resistance.

What is claimed is:

1. A test pattern, used for testing a contact resistance of a subject via hole of a semiconductor substrate, comprising:
   a first conductive pattern connected to the subject via hole and formed on a lower surface of the semiconductor substrate;
   a second conductive pattern connected to the subject via hole and formed on an upper surface of the semiconductor substrate;
   first and second electrodes formed on the second conductive pattern, the electrodes for connection to test probes;
   third and fourth electrodes formed on the upper surface of the semiconductor substrate;
   a first test via-hole formed through the semiconductor substrate to connect the first conductive pattern and the third electrode electrically to each other; and
   a second test-via hole formed through the semiconductor substrate to connect the first conductive pattern and the fourth electrode electrically to each other,
   wherein the first and third electrodes are connected to a current test probe so as that a test current is flowing through the first electrode, the subject via hole, the first test via-hole and the third electrode in this order, and
   wherein the second and fourth electrodes are connected to a voltage test probe so as that a test voltage is applied through the second electrode, the subject via hole, the second test via-hole and the fourth electrode in this order.

2. A test pattern according to claim 1, further comprising first and second upper patterns formed on an upper surface of the semiconductor substrate, wherein the third and fourth electrodes are respectively mounted on the first and second upper patterns.

3. A semiconductor structure, comprising:
   a semiconductor substrate having a subject via hole of which a contact resistance is to be tested;
   a test pattern used for testing an electrical characteristic of the semiconductor substrate, the test pattern including
      (a) a first conductive pattern connected to the subject via hole and formed on a lower surface of the semiconductor substrate,
      (b) a second conductive pattern connected to the subject via hole and formed on an upper surface of the semiconductor substrate, (c) first and second electrodes formed on the second conductive, pattern, the electrodes for connection to test probes, (d) third and fourth electrodes formed on an upper surface of the semiconductor substrate;

(e) a first test via-hole formed through the semiconductor substrate to connect the first and second conductive pattern electrically to each other, (f) a second test-via hole formed through the semiconductor substrate to connect the first conductive pattern and the fourth electrode electrically to each other;

wherein the first and third electrodes are connected to a current test probe so as that a test current is flowing through the first electrode, the subject via hole, the first test via-hole and the third electrode in this order, and wherein the second and fourth electrodes are connected to a voltage test probe so as that a test voltage is applied through the second electrode, the subject via hole, the second test via-hole and the fourth electrode in this order.

4. A semiconductor structure according to claim 3, further comprising first and second upper patterns formed on an upper surface of the semiconductor substrate, wherein the third and fourth electrodes are respectively mounted on the first and second upper patterns.

* * * * *